United States Patent [19]

Duvvury et al.

[11] Patent Number: 5,648,920

[45] Date of Patent: Jul. 15, 1997

[54] METHOD AND APPARATUS FOR DERIVING TOTAL LATERAL DIFFUSION IN METAL OXIDE SEMICONDUCTOR TRANSISTORS

[75] Inventors: Charvaka Duvvury; Janet L. Wise, both of Plano, Tex.

[73] Assignee: Texas Instruments Incorporated, Dallas, Tex.

[21] Appl. No.: 343,403

[22] Filed: Nov. 22, 1994

[51] Int. Cl.$^6$ .................................................. G06F 17/50
[52] U.S. Cl. ............................................ 364/578; 364/488
[58] Field of Search ...................... 364/488, 489, 364/578

[56] References Cited

U.S. PATENT DOCUMENTS 5,410,490  4/1995  Yastrow .................................. 364/488
5,461,572  10/1995  Ichikawa ................................ 364/488

OTHER PUBLICATIONS

"Spice Modeling for Small Geometry MOSFET Circuits," Ping Yang, Member, IEEE, and Pallab K. Chatterjee, Member, IEEE, IEEE Transactions On Computer–Aided Design of Integrated Circuits and Systems, vol. CAD–1, No. 4, Oct. 1982.

"A Novel Method to Determine Gate–Drain Overlap in Sub–Micron Transistors," C. Duvvury, J.L. Wise, C.F. Machala, and P. Yang, Texas Instruments Incorporated Semiconductor Process and Design Center, Dallas, Texas, presented at IEDM, Dec. 1993.

F.E. DeLaMoneda, H.N. Kotecha, and M. Shatskes, "Measurements of MOSFET Constants," IEEE Electron Device Letters, vol. EDL–3, 1982.

S.E. Laux, "Accuracy of Effective Channel/External Resistance Extraction Algorithm for MOSFET's," IEEE Tran. on electron Devices, vol. ED–31, 1984.

G. Hu, C. Chang and Y. Chia "Gate–Voltage Dependent Effective Channel Length and Series Resistance of LDD MOSFET's," IEEE Tran. on Electron Devices, vol. ED–34, No. 12, Dec. 1987.

K. Terada and H. Muta, "A New Method to Determine MOSFET Channel Length," Japn. J. Appl. Phys., vol. 18, p. 935, 1979.

B.J. Sheu, P.K. Kos, "A Capacitance Method to Determine Channel Lengths for Conventional and LDD MOSFETs," IEEE Electron Device Letters, vol. EDL–5, No. 11, Nov. 1984, p. 491.

Primary Examiner—Vincent N. Trans
Attorney, Agent, or Firm—Jacqueline J. Garner; W. James Brady, III; Richard L. Donaldson

[57] ABSTRACT

A method and apparatus for deriving total lateral diffusion in MOS transistors includes deriving (40) a DC model. The DC model is then verified (42) with a multifinger transistor. The gate of the multifinger transistor is then isolated (44). Voltage pulses are then applied (46) to the multifinger transistor, and the current attributable to the voltage pulses is measured (48). Using the model, estimates of the total lateral diffusion are adjusted (50) until the modelled current matches the measured current. Finally, the complete and accurate AC/DC model can be used (52) by circuit designers to design various circuits that will operate as designed when implemented.

20 Claims, 8 Drawing Sheets

METHOD AND APPARATUS FOR DERIVING TOTAL LATERAL DIFFUSION IN METAL OXIDE SEMICONDUCTOR TRANSISTORS

TECHNICAL FIELD OF THE INVENTION

This invention relates generally to integrated circuits, and more particularly to a method and apparatus for deriving total lateral diffusion in metal oxide semiconductor transistors.

BACKGROUND OF THE INVENTION

Applications for metal oxide semiconductor field effect transistors ("MOSFETs") are extremely widespread. Demands for increased functionality from smaller chip areas requires that these transistors be downsized. However, as they are downsized, their performance is increasingly affected by various parasitic capacitances. Therefore, it becomes extremely important to understand both the DC and AC performance characteristics of the transistors before circuits are designed. Otherwise, circuits will not work as designed.

For example, when designing a high speed CMOS circuit, with design dimensions in the sub-micron range, an imprecise DC or AC model may result in a circuit design that simply does not work when implemented in silicon. In particular, a model that underestimates various capacitances can result in a circuit designed for an operating speed that will not meet that speed when implemented.

The designed channel length ("$L_{des}$") Of a transistor is comprised of the sum of the effective channel length ("$L_{eff}$"), the gate length reduction ("LR") (caused due to polysilicon patterning of the gate), and the total lateral diffusion ("TLD") (which causes gate-drain overlap). By using these parameters, among others, fairly accurate DC models for MOSFETs can be derived, for example, with the SPICE design tool.

Techniques exist for determining $L_{eff}$. However, generally only the sum of LR and TLD is obtained, which is acceptable for the DC model, since that sum is all that is necessary for an accurate DC model. In contrast, the AC performance of the transistor depends critically on the TLD, and existing techniques do not allow for an accurate and straightforward determination of TLD.

Gate-to-drain overlap (the use of this term herein includes gate-to-source overlap) caused by TLD results in increased overlap capacitance that slows down circuit speed due to what is known as the Miller Effect. In the AC operation, this effect causes either overshoots or undershoots in the waveforms that result in increased delay time for propagation.

SUMMARY OF THE INVENTION

Therefore, a need has arisen for a method and apparatus for deriving total lateral diffusion in MOS transistors which substantially eliminates or reduces disadvantages and problems associated with prior art systems.

In particular, a method of deriving lateral diffusion in transistors is provided in which a DC model is established a priori for transistors, the model allowing for input of an estimate of the lateral diffusion. A gate of a test transistor is then isolated, and a voltage pulse is applied to the drain of the test transistor. Next, the drain current of the test transistor is measured. Using the DC model, a modelled current is generated for a model transistor under substantially the same conditions as that of the test transistor. The measured drain current is then compared with the modelled current, and the estimate of the lateral diffusion is adjusted until the modelled current is substantially the same as the measured drain current. The value of the estimate of lateral diffusion that results in substantially the same current and is substantially the correct value of lateral diffusion.

Furthermore, a system for generating an AC model of transistors is provided in which a design tool is operable to establish a DC model for the transistors, the design tool allowing for input of an estimate of a parameter related to lateral diffusion. A test transistor has a drain, and a gate which can be isolated. A current probe measures drain current of the test transistor, with the gate isolated, in response to an AC voltage pulse applied to the drain of the test transistor. The design tool is operable to generate a modelled current of the model transistor under substantially the same conditions as that of the test transistors. The design tool is further operable to adjust the estimate of the parameter until the modelled current is substantially the same as the measured drain current, and the value of the estimate of the parameter that results in substantially the same current is substantially the correct value of the parameter. The parameter may be the total lateral diffusion or the capacitance substantially attributable to the total lateral diffusion.

An important technical advantage of the present invention is the fact that an accurate determination of total lateral diffusion is made, thereby allowing for a more precise AC model for MOS transistors. This improved AC model allows circuit designers to create designs which will reliably operate once implemented in silicon.

Another important technical advantage of the present invention is the fact that it provides a method and apparatus for determining total lateral diffusion at operating biases, thereby providing for a more precise AC model for MOS transistors.

Another important technical advantage of the present invention is that the same transistor may be used to develop both the DC and AC models, thereby allowing for more accurate transistor modelling.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
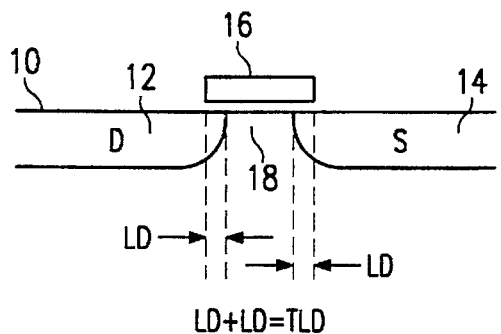
FIG. 1 illustrates a side view of the MOS transistor with lateral diffusion.

FIG. 1 illustrates a side view of a typical metal oxide semiconductor field effect transistor ("MOSFET"). As shown in FIG. 1, a semiconductor substrate 10 is provided. Semiconductor substrate 10 is typically a silicon substrate, although other substrates may also be used. Substrate 10 may be n-type or p-type, for PMOS or NMOS, respectively. Drain region 12 and source region 14 are created in substrate 10. The drain and source regions are typically created by implanting dopants into the substrate 10. For example, dopants such as phosphorus can be used with n-channel transistors, and boron with p-channel transistors.

A polysilicon gate 16 is formed insulatively adjacent the semiconductor substrate 10. The gate 16 is separated from the substrate 10 by an insulating layer, which is generally a silicon dioxide layer. A channel region 18 underlies gate 16, through which charge carriers flow between drain 12 and source 14.

As shown in FIG. 1, a portion of the drain 12 and the source 14 extends under gate 16. This extension is generally referred to as lateral diffusion. The distance that the drain or source extends under the gate 16 is LD. Thus, the total lateral diffusion ("TLD") is equal to LD +LD, or 2LD.

It is significant that the TLD changes depending upon the bias placed on the drain or the source. Thus, an accurate AC model must take into account such changes.

Figure 2:
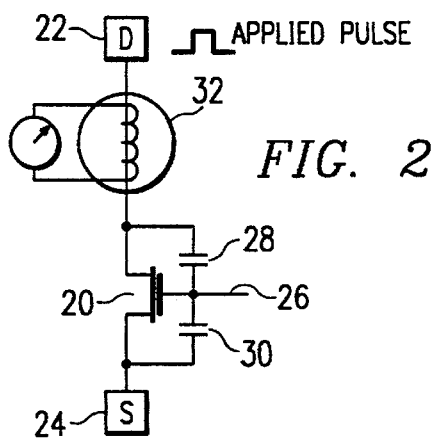
FIG. 2 illustrates a circuit for measuring drain current in a MOS transistor according to the teachings of the present invention.

FIG. 2 illustrates a circuit schematic of a test circuit used in measuring TLD according to the teachings of the present invention. As shown in FIG. 2, a MOS transistor 20 is provided with a drain pad 22 and source pad 24. The gate 26 of the transistor 20 is floating. Alternatively, gate 26 can be coupled to the cathode of a diode coupled to the substrate. Also shown in FIG. 2 are capacitors 28 and 30. These capacitors are circuit diagram representations of the capacitance caused by the lateral diffusion of the source and drain regions of the transistor 20.

The transistor 20 shown in FIG. 2 is a test transistor, formed with the same technology that will be used to implement the circuits for which the model is being derived. The test circuit of FIG. 2 will be used to determine TLD, which will then be fed back into the AC model for use by circuit designers. The test circuit may also be made as part of the semiconductor chip on which the designed circuit is implemented, for purposes of evaluating the semiconductor process, as well as to evaluate process variations, for example, from lot to lot.

Also shown in FIG. 2 is a current probe 32 coupled between the drain pad 22 and the drain of transistor 20. With the present invention, a voltage pulse (or series of pulses) is applied to the drain of transistor 20, with the gate 26 floating. With the gate 26 floating, the drain current caused by the pulse will be determined by the amount of voltage that is coupled from the drain to the gate 26, which is primarily due to the capacitance caused by the total lateral diffusion. Thus, measuring the current through the drain under these circumstances gives an indirect measurement of the TLD and capacitance caused by the TLD. The TLD can be determined from this measured current through the use of formulas, or through the use of design tools, such as SPICE, to be discussed below.

The pulse or pulses applied to the drain of transistor 20 should be of short enough duration so that the drain current is stable with drain bias. For example, for a 500 micrometer wide and 0.6 micrometer long channel, and a 100 angstrom oxide thickness, a pulse of approximately 500 to 600 nanoseconds may be used. The current probe 32 shown in FIG. 2 must be sensitive enough to measure currents caused by such short duration pulses. As an example, a current probe marketed as model number CT-1 by the Tektronix Company can be used.

The voltage height of the applied pulses can be varied, so as to provide current readings for different bias voltages on the drain. For example, the pulse voltages may be stepped between 4 and 7 volts, as will be discussed below in connection with FIGS. 4 and 5. Stepping the voltages in this range provides current values for voltage biases that will likely be encountered during normal circuit operation. It should be understood, however, that depending on the design of the MOS circuit, other voltages may be appropriate. In particular, the voltage pulses used with the test circuit of FIG. 2 should be in the range of voltages that will be actually applied to the transistors of the circuit for which the model is being derived.

Figure 3:
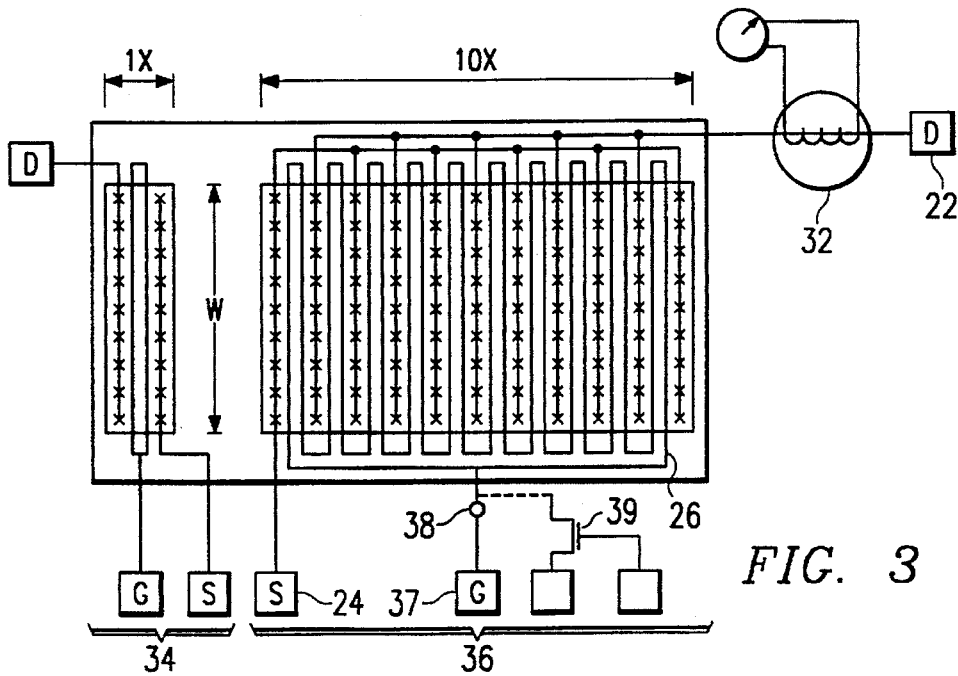
FIG. 3 illustrates top view of single-finger and multifinger transistors for use in determining total lateral diffusion according to the teachings of the present invention.

FIG. 3 illustrates the top view of the layout of particular test circuitry which may be used for determining the TLD (or capacitance caused by the TLD) according to the teachings of the present invention. As shown in FIG. 3, a "single-finger" transistor 34 and a "multifinger" transistor 36 are provided. Transistor 34 has a single gate finger. Transistor 36 has a plurality of gate fingers, and in the particular example shown, transistor 36 has 10 gate fingers. Multifinger transistor 36 is a particular example of the transistor 20 shown in FIG. 2. Thus, the same reference numerals will be used for the drain and source pads for transistor 36 as were used for transistor 20 in FIG. 2. The multifinger gate is coupled to gate pad 37.

With the layout shown in FIG. 3, the single-finger transistor can be used to determine a DC model. This DC model can be determined with known techniques, such as those cited in "A Novel Method to Determine Gate-Drain Overlap In Sub-Micron Transistors," C. Duvvury, et al., IEDM, December 1993, which is included below toward the end of the specification.

As another example of DC modelings, see P. Yang and P. Chatterjee, *IEEE Transactions on Computer-Aided Design of Integrated Circuits and Systems*, Vol. CAD-1, No. 4, P. 169, 1982. For complete modelling, many relevant parameters should be modelled, such as the mobility, the effective channel length, the effective channel width, the voltage threshold, the mobility degradation parameter, and various capacitances, such as the oxide capacitance and diffusion capacitances. The DC model will then be used to accurately determine the TLD.

The multifinger transistor 36 shown in FIG. 3 serves at least two purposes. First, because of its size, enough drain current will be produced during the pulsing process described above for accurate current measurement by the current probe 32. Furthermore, the multifinger transistor 36 may be used to verify and refine the DC model derived from transistor 34, before determining the TLD.

For this verification process, a full saturation region curve for the multifinger transistor 36 is derived by applying a $V_{cc}$ bias from the drain 22 to the source 24 and sweeping gate 26 from 0 to less than $V_{cc}$. A limit of approximately 100 milliamps may be used for the purpose of using characterization systems such as the Hewlett-Packard 4145. The measured saturation curve for the multifinger transistor 36 is then compared with the same curve from the model derived from the single-finger device 34. This model curve can be generated with the SPICE design tool. Ideally, the only difference will be that the magnitude of the measured current for the multifinger device will be greater than that from the model from the single-finger device. For the example shown in FIG. 3, the multifinger device has 10 fingers, and thus its current should be 10 times larger than that of the model from single-finger device. To bring the DC model in conformity with the actual measured curve from the multifinger device, the SPICE DC parameters can be adjusted until the model matches the actual measured curve. For example, either or both the voltage threshold and mobility values on the SPICE DC model may be adjusted to obtain an acceptable match between the model curve and the measured curve. Once this is performed, an accurate DC model will be provided. However, an accurate AC model will be achieved only when the TLD or the capacitance caused by the it has been determined.

As discussed above in connection with FIG. 2, the drain current is determined with the gate of the test transistor floating. Thus, as shown in FIG. 3, a laser fuse 38 is provided between the gate pad 37 and the gate body of the transistor 36. After measuring the saturation region curve for the multifinger device, the laser fuse 38 is blown, thus allowing the gate to float and eliminating capacitance caused by the gate pad 37. It should be understood that laser fuse 38 is shown as a particular way of isolating the gate of the transistor 36. However, it should be understood that any other device or technique capable of isolating the gate may be used without departing from the intended scope of the present invention. For example, the multifinger transistor 36 may be isolated with a transfer or pass gate transistor 39 shown with a dashed line in FIG. 3.

Once the gate of transistor 36 has been isolated, then the pulses described above in connection with FIG. 2 are applied to drain pad 22. The voltages of these pulses are adjusted so as to measure the drain current (with the gate floating) for different drain bias conditions. As discussed above, the voltage levels used for the bias pulses should be in the range of those that will be encountered by the transistors in the circuit for which the model is being derived.

To determine the TLD, the actual current measured for the different voltage pulses is compared to the modelled current derived from the DC model. The model is adjusted until the modelled current matches the measured current. The DC model is used to generate the modelled current for a transistor having parameters the same as that of the test transistor, with a floating gate.

Figure 4:
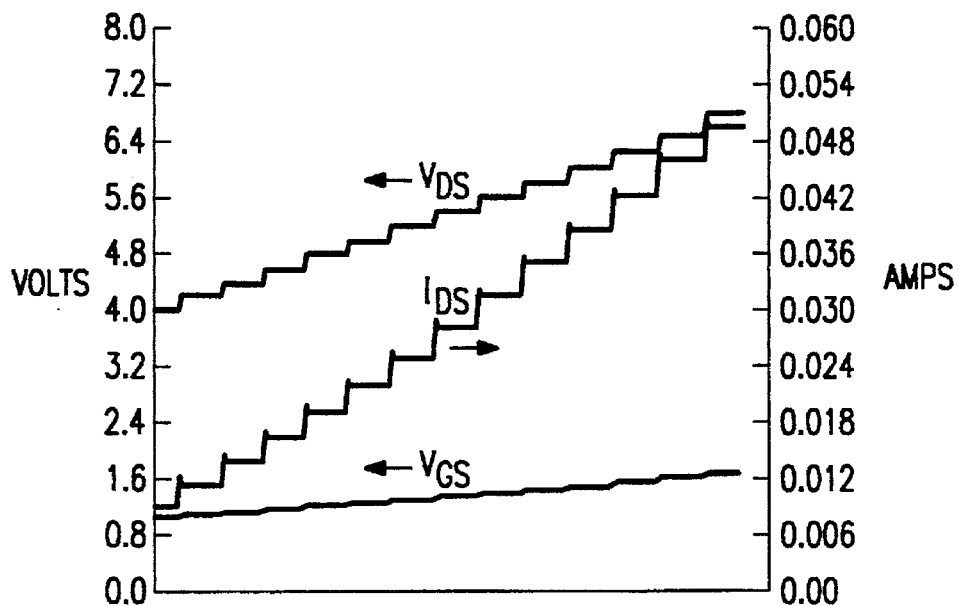
FIG. 4 is a graph of drain current at various drain voltages with an assumed value of TLD according to the teachings of the present invention.
Figure 5:
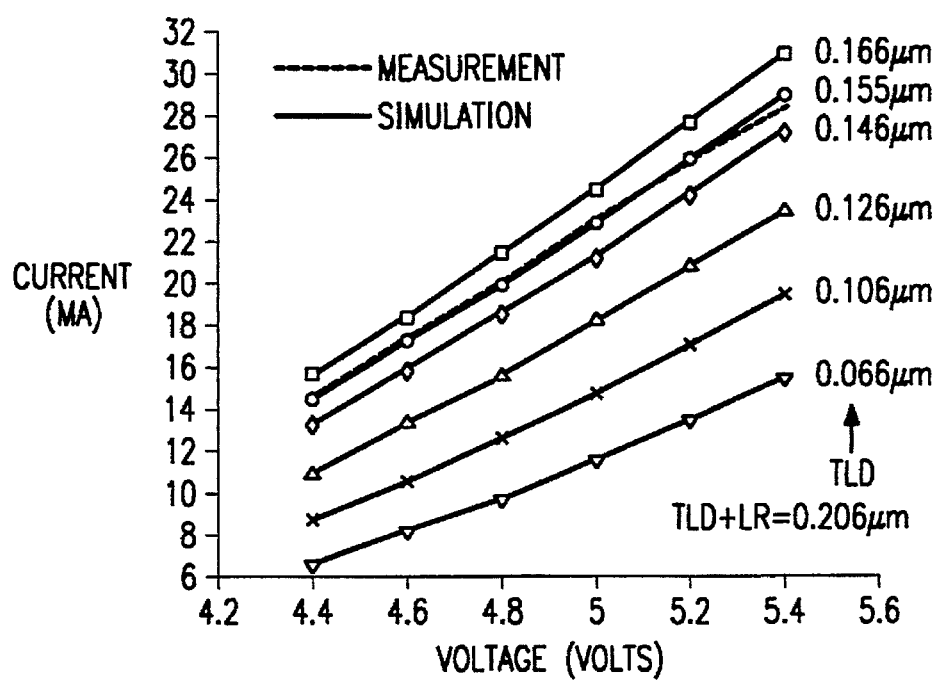
FIG. 5 is a graph illustrating a match of measured and simulated transistor I–V responses.

As shown in FIGS. 4 and 5, various I–V curves are generated by the model for different voltage pulses and different estimated TLDs. The SPICE model allows for input of the estimated TLD as a parameter. A further advantage of using this method with SPICE is that the SPICE program automatically places the transistor into the proper operating region depending on the selected TLD value. However, it should be understood that models allowing for input of the estimated capacitance caused by the TLD may be used as well.

FIG. 4 illustrates the relationship between drain voltage and modelled drain current at one particular estimated TLD. FIG. 5 illustrates the I–V relationship for various estimated TLDs.

By comparing the measured curve with the model curves, a best-fit comparison can be used to determine the best estimate of the TLD (or the capacitance attributable to the TLD). FIG. 5 illustrates a particular example in which the I–V relationship was determined for TLD estimates from 0.066 micrometers to 0.166 micrometers. As can be seen from FIG. 5, the curve corresponding to a TLD length of 0.156 matches most closely with the measured curve.

An important advantage of the present invention is the fact that TLD is determined based on biases applied to the transistor drain. Thus, the TLD will take into account the depletion width movement caused by biasing.

Figure 6:
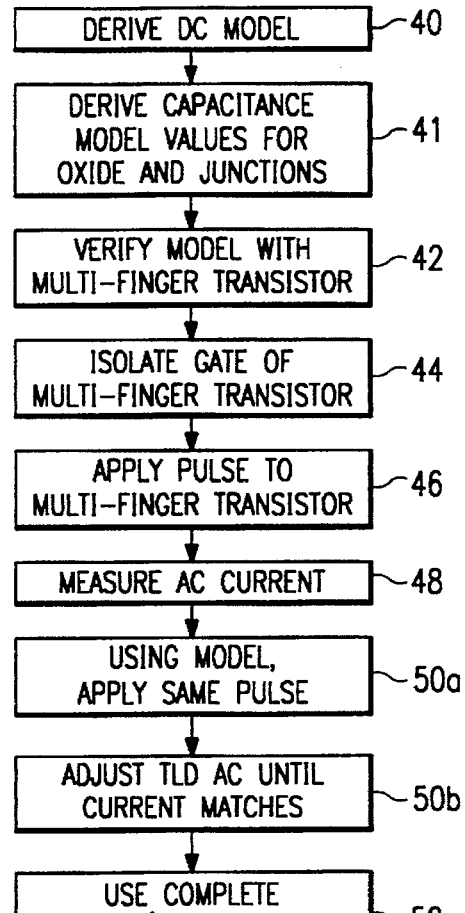
FIG. 6 illustrates a flow diagram of a method of determining total lateral diffusion according to the teachings of the present invention.

FIG. 6 illustrates a flow diagram of a method of determining TLD according to the teachings of the present invention. As shown in FIG. 6, a DC model is first derived. This DC model can be derived using known techniques. The complete AC model requires the values for junction and oxide capacitance. At step 41, these are separately obtained from test structures with known techniques. For a correct AC model, however, the correct value of TLD must still be determined. Next, at block 42, the DC model may be verified with a multifinger transistor, as discussed above in connection with transistor 36. This step is not necessary, but is useful in fine-tuning the DC model. Next, at step 44, the gate of the multifinger transistor is isolated. As discussed above, this can be accomplished by using a laser fuse. Alternatively, the gate can be formed without any connections, and thus the gate would already be isolated. Such a transistor, with an already isolated gate, would not be available for use in step 42 in verifying the originally-derived DC model.

At step 46, a pulse at a particular voltage, or a series of pulses at different voltages, is applied to the drain of the multifinger transistor. At step 48, the current is measured for each of the applied pulses.

At step 50, a the already derived DC model is used to compare the measured current with a modelled current for the same pulses. With the model, at step 50b TLD estimates are adjusted until a match exists between the measured current and the modelled current. When a match is found, the estimated TLD is substantially the correct TLD.

At step 52, the complete DC and AC models can then be used by circuit designers to accurately design MOS circuits that will be reliably implemented in silicon. Furthermore, the techniques described above can be used for comparing process variations from lot to lot so as to improve quality control.

In summary, a method and an apparatus for accurately measuring TLD is provided. Drain current is generated with voltage pulses and measured in an actual transistor with an isolated gate. The current measured in this process is then compared with a modelled current for a modelled transistor with a floating gate and the same voltage pulses. The TLD estimate of the model is adjusted until a match occurs between the measured current and the modelled current.

Although the invention has been described in connection with n-channel devices, it is equally applicable to p-channel devices. In the case of PMOS transistors, negative pulses are applied while the source and the substrate (n-well) are tied to ground. The same procedure is then followed on a p-channel structure similar to that shown in FIG. 3 for derivation of the effective AC lateral diffusion parameter. Appendix A (5 pages), attached hereto, describes the detailed description of FIGS. 7–16.

Although the present invention has been described in detail, it should be understood that various modification, substitutions, or additions can be made to this description without departing from the intended scope as defined the appended claims.

APPENDIX A

A NOVEL METHOD TO DETERMINE GATE-DRAIN OVERLAP IN SUB-MICRON TRANSISTORS

C. Duvvury, J. L. Wise, C. F. Machala, and P. Yang

Texas Instruments Incorporated

Semiconductor Process and Design Center

MS 369, P.O. Box 655012

Dallas, Texas 75265

Abstract

This paper describes a novel method to determine the gate-drain overlap in a sub-micron channel length transistor under circuit operating conditions. The method essentially entails applying 500 ns wide square wave pulses to the MOSFET drain and measuring the drain current response as determined by the gate coupling which, in turn, is determined by the gate-drain overlap capacitance. After obtaining an accurate DC current model, the pulse measurements are matched with SPICE simulations to determine the accurate value for total lateral diffusion.

1. Introduction

In modeling of MOSFETs, there are several good methods in the literature to obtain the effective channel length with DC drain current measurements [1–4]. This Leff is composed of gate length reduction (LR) due to polysilicon patterning and total lateral diffusion (TLD) that leads to gate-drain overlap. The AC performance of the transistor depends critically on the gatedrain overlap capacitance and cannot easily be inferred from measurements. With the current advanced technologies the gate flinging effects make this even more uncertain. There have also been some papers published that deal with estimating this overlap with capacitance measurements methods [vis. 5]. While such methods are useful, they may not give the most accurate value for TLD, at least for the region of actual circuit operation. In this paper, a technique to accurately extract this parameter under circuit operating conditions using square wave pulse measurements on large gate-coupled transistors and its verification with delay chain data, is reported for a 0.6 μm CMOS technology.

Figure 7:
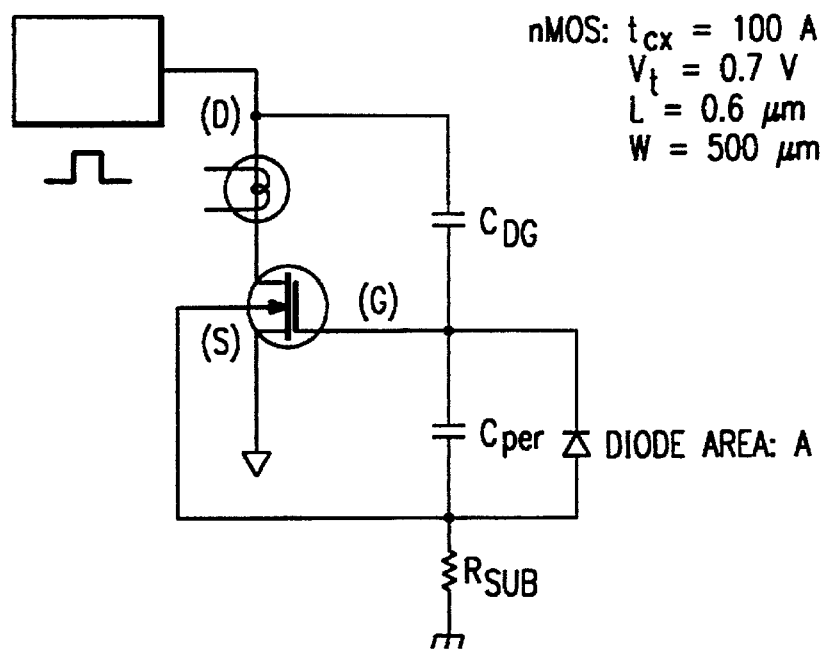
FIG. 7 illustrates a gate coupled test NMOS structure.

We used a large 500/0.6 μm nMOS gate-coupled device as shown in Fig. 7. A diode to substrate is tied to the gate to allow variation of the gate coupling level. In the figure, Cpar is the parasitic capacitance associated with gate layout outside the channel region, gate fringing capacitance, and the diode to substrate capacitance. The first two components are negligibly small. In our initial experiment the diode area roughly corresponds to a junction to substrate capacitance $C_{Diode}$ of 7 fF. Since this is such a small capacitance compared to the drain-gate overlap component, it is virtually equivalent to a floating gate and will not have any influence on the level of gate coupling. Now with any bias applied on the drain, the coupling on the gate is automatically determined through SPICE by the region of transistor operation, the ratio of drain-gate overlap capacitance (Cdg), and the oxide capacitance (Cox). The gate bounce is typically above the transistor $V_t$ for 5 V on the drain to allow extraction of TLD under circuit operating conditions. This novel method involved: (1). Fully characterize the transistor to obtain a DC model with a fit error less than 5%. (2). Measure the dynamic coupling using square wave pulses. (3). Finally, use the derived model in SPICE to match with the gate-coupling measurements to determine the best fit value for TLD.

2. Experimental Method

Figure 8:
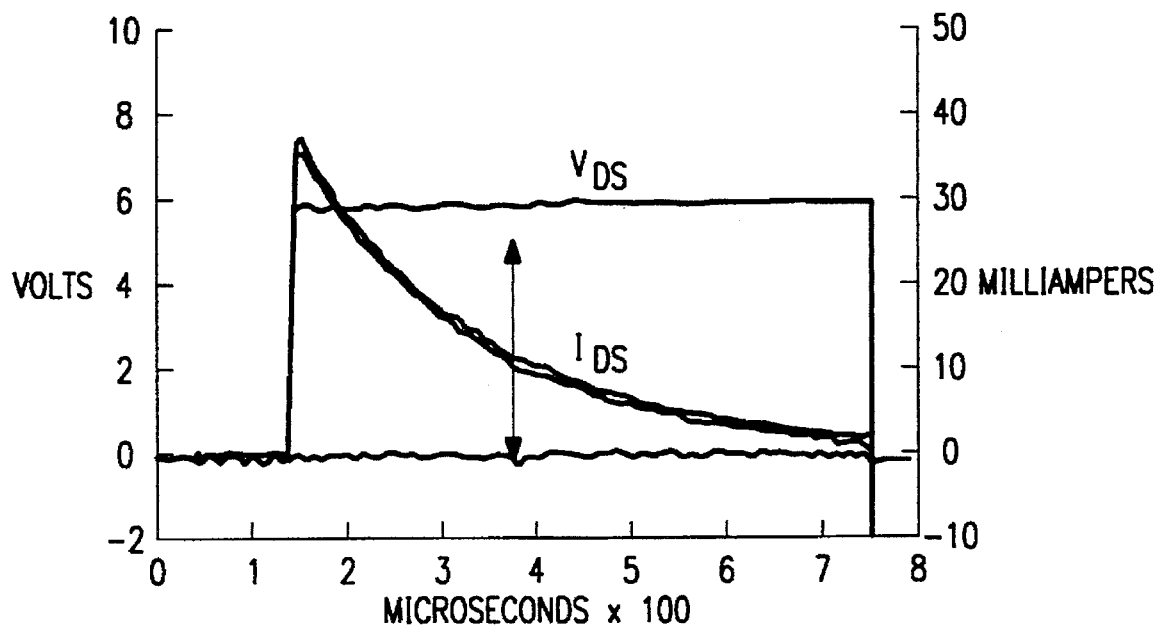
FIG. 8 illustrates drain current response for a drain voltage pulse of 600 µs.
Figure 9:
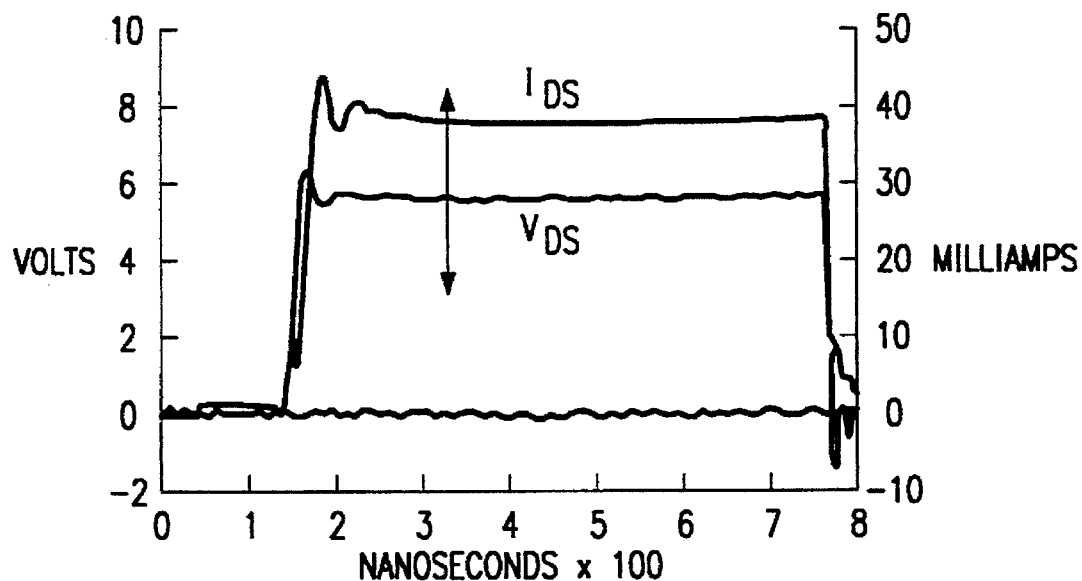
FIG. 9 illustrates a drain current response for a drain voltage pulse of 600 ns.
Figure 10:
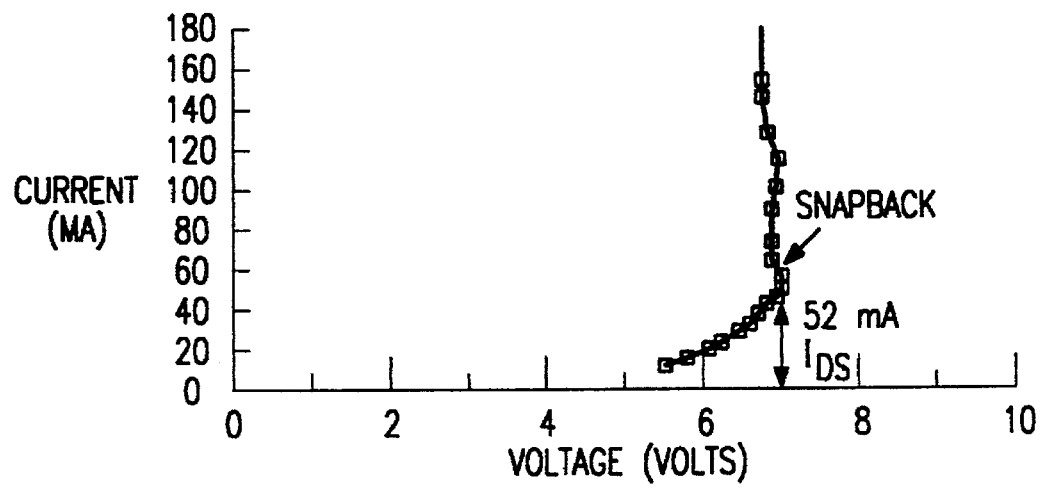
FIG. 10 illustrates I–V breakdown characteristics for a 0.6 µA channel length NMOS transistor. Note that at 7 V the MOS current is 52 mA just before npn trigger.

Standard transistor characterization methods using apparatus such as a curve tracer or a HP 4145 cannot be used to measure the amount of gate coupling because the gate would discharge with a time constant typically in the 100 μs range. This gate leak off is illustrated in Fig. 8 where the drain current response was measured using a current probe with an applied drain pulse of 600 μas. At an amplitude of 6 V, the drain current reaches a peak of about 35 mA and discharges with a time constant of 240 μs. To obtain a more accurate assessment of this current due to gate coupling, the pulse width was reduced to 600 ns as shown in Fig. 9. It can be seen that the drain current is now stable with drain bias. This method is more accurate since the inductive ringing during the first two hundred nanoseconds can be ignored, and, with the large MOS transistor, the current level is high enough to be measured accurately by the current probe to estimate the proper TLD.

The structures used in this work were 0.6 μm polysilicon gate transistors of 100 Å gate oxide. Square wave pulses of 500 ns were used to obtain the dynamic coupling for 500/0.6 μm nMOS LDD transistors built with 100 Å gate oxide. The total I–V breakdown curve obtained in this manner is shown for this transistor in Fig. 10. As can be seen, after 7 V on the NMOSFET drain, the drain current increases rapidly since the MOSFET goes through avalanche and eventually parasitic npn snapback. Therefore in our characterization the drain voltages were kept below 7 V. The measured drain current for each drain bias can be used to estimate the TLD parameter.

3. Simulation Matching

Figure 11:
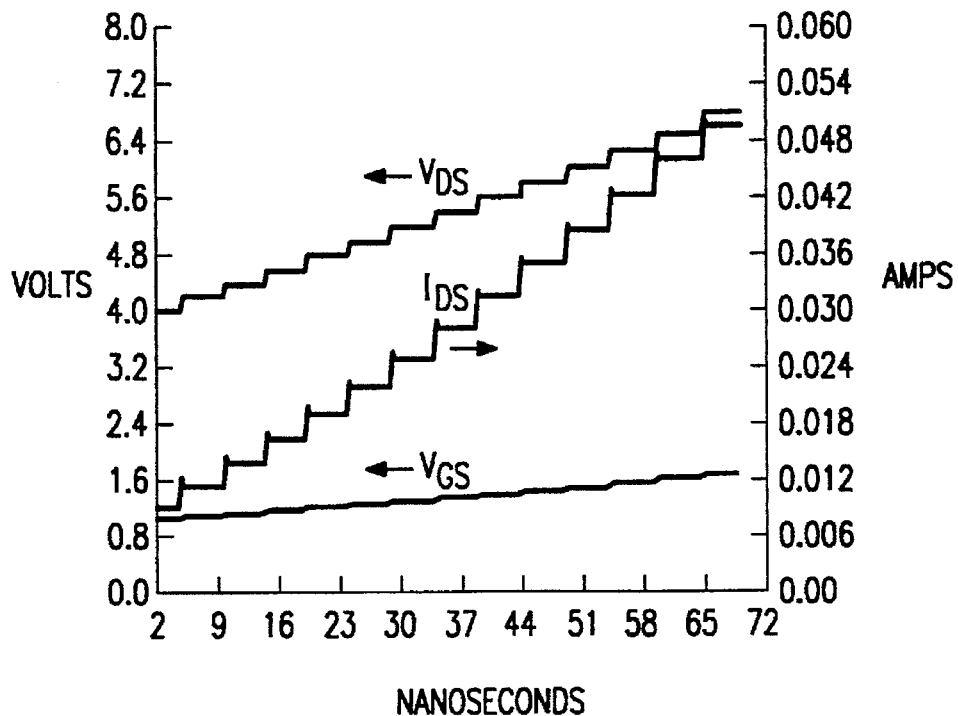
FIG. 11 illustrates SPICE simulations of the gate-coupled device, the time scale on the X-axis has no meaning.
Figure 12:
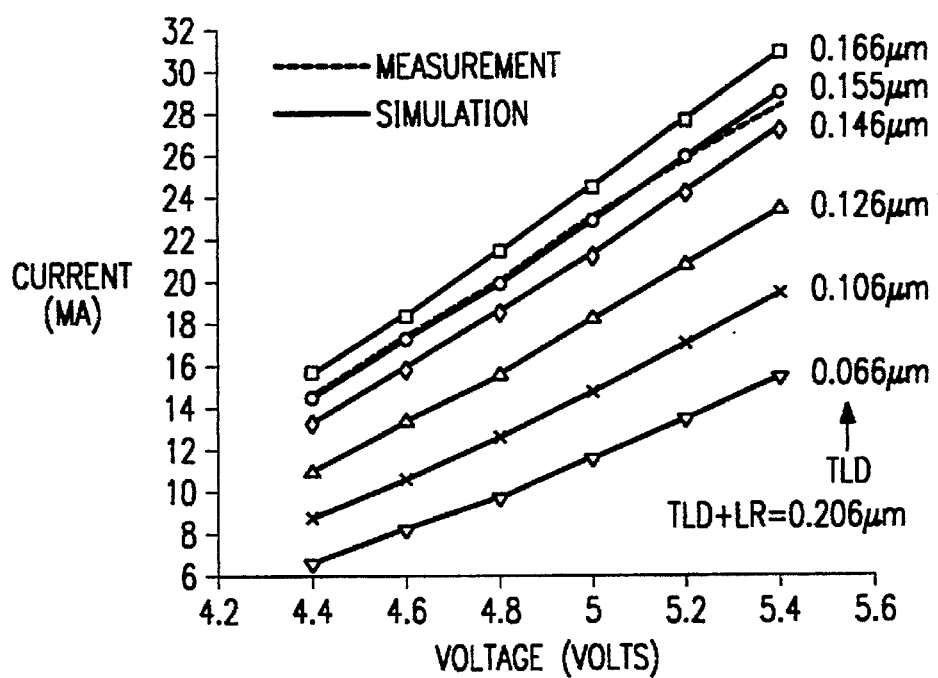
FIG. 12 illustrates SPICE simulations of I–V responsed for various TLD values, the measured data is shown by the dashed lines.
Figure 13:
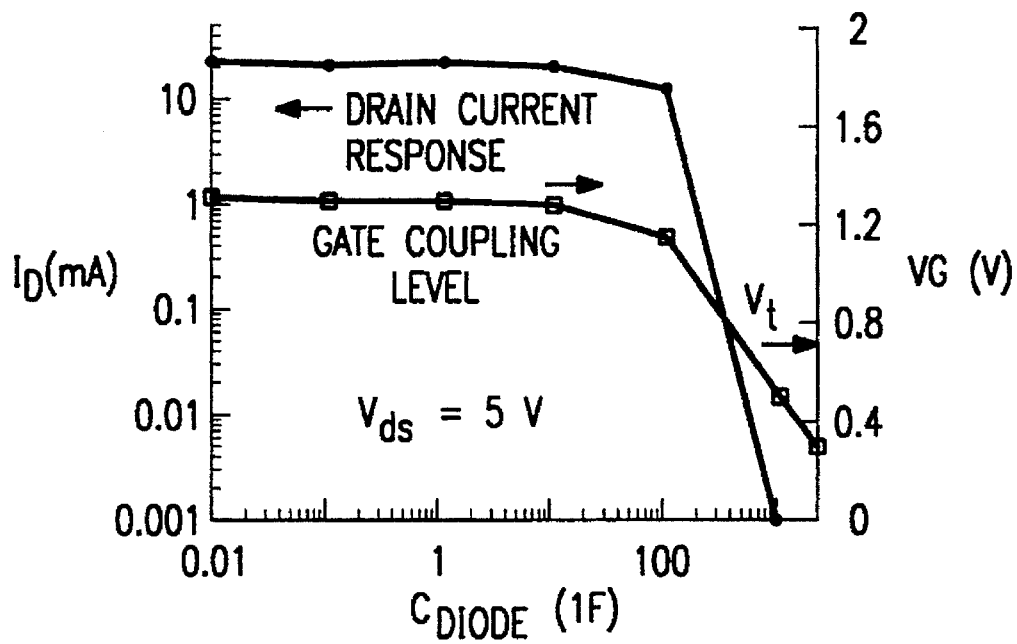
FIG. 13 illustrates the effects of $C_{DIODE}$ on the gate coupling and current response.

The transistor DC model was derived by obtaining full I–V curves on a selected set of devices of different channel lengths and widths. Before fitting the data to derive a scalable model, the critical parameter of effective channel length was extracted using gate capacitance data on block and finger structures [6]. This procedure yields the values for oxide thickness (Tox) and as well as total length reduction such that Leff=Ldesign-(LR+TLD). For the 0.61 μm transistor modeled here we obtained the LR +TLD to be 0.206 μm. The final DC model had a fit error less than 5%. The next step is to determine the actual value for the TLD portion. Using this DC model, SPICE simulations were done as shown in Fig. 11 where we used a voltage stairstep for drain voltage and noted the drain current at each level. This procedure was repeated for each assumed value of TLD. Note here that TLD was selected to be a variable fraction of the total length reduction, LR+TLD. The SPICE results for each assumed TLD are shown in Fig. 12. These curves clearly illustrate the sensitivity of TLD to the I-V behavior. It should be noted again that since LR+TLD was constant for each case, all six curves in Fig. 12 correspond to a correct DC model but only one represents the actual AC model. Using carefully measured pulse tester data in the range from 4 to 6.5 V, we extracted a best fit TLD of 0.156 μm for this transistor. The measured data is shown in Fig. 12 as dashed line.

4. Model Verification

Figure 14:
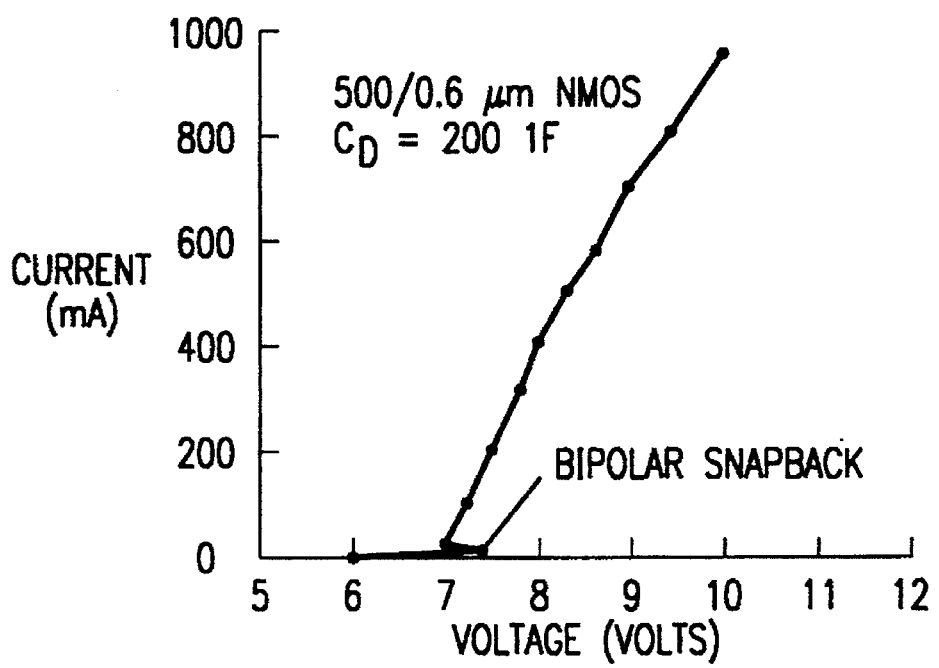
FIG. 14 illustrates high current I–V characteristics of the gate coupled device.
Figure 15A:
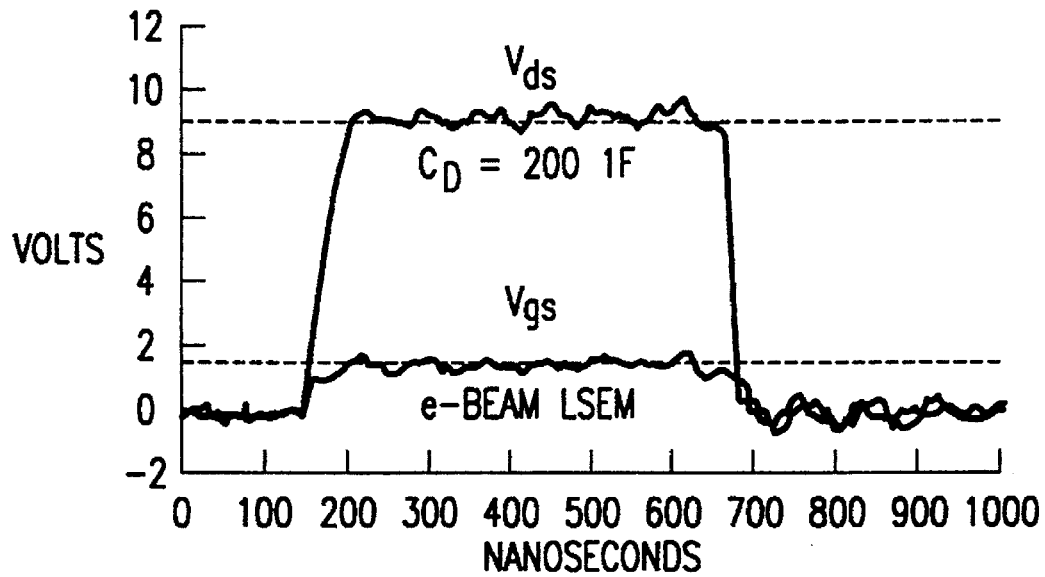
FIG. 15A illustrates E-beam responses showing gate voltage level correspondings to drain voltage level of 9 V.
Figure 15B:
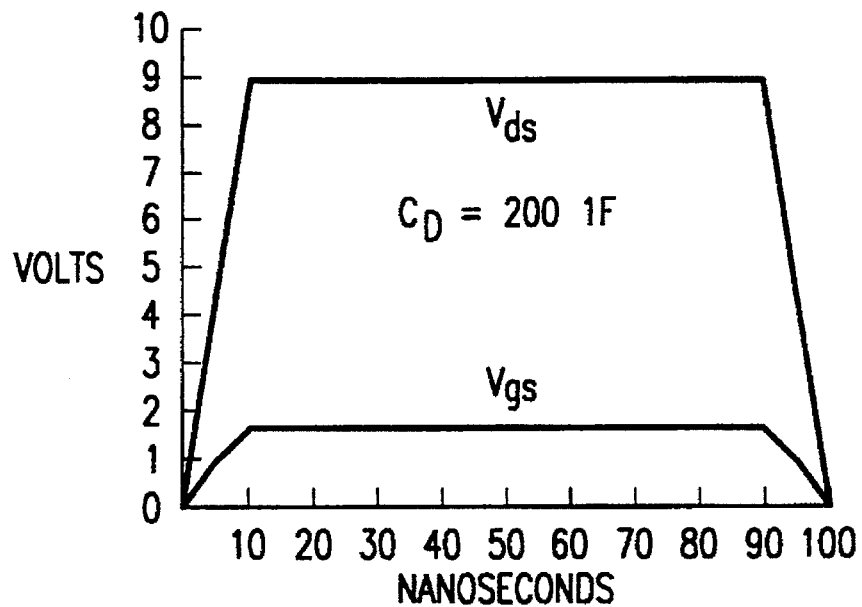
FIG. 15B illustrates a SPICE simulation corresponding to the e-beam measurements in FIG. 15A.

In Fig. 7, as the diode capacitance ($C_{Diode}$) is increased the gate coupling is expected to decrease. This effect is shown through SPICE simulations in Fig. 13 using the derived AC model for $V_{ds}=5$ V. To verify the AC TLD model, we measured the I-V curves corresponding to a device with $C_{Diode}=200fF$. These curves in the high current region are shown in Fig. 14. Notice now that with the expected lower gate coupling level, the MOS current before snapback is smaller at less than 10 mA compared to 50 mA in Fig. 10. This measured current level was verified using SPICE for these same conditions. With the current level beyond 50 mA, the voltage begins to increase due to the parasitic device resistance of the lateral bipolar transistor under snapback. In Fig. 14, at greater than 600 mA current level the voltage at the drain (connected to the pad) can reach about 9 V level. In this mode of operation also the gate coupling is determined by the TLD value. In order now to independently verify the AC model, the gate coupling at this current level was measured using voltage contrast analysis. The sample was stressed with positive pulses of 40 kHs at greater than 500 mA level and the drain and gate voltage responses were observed with an e-beam. The measured waveform is shown in Fig. 15A where for a drain voltage of 9 V the gate coupled up to about 1.6 V. The agreement with SPICE under these conditions is illustrated with the AC model in Fig. 15B.

Figure 16:
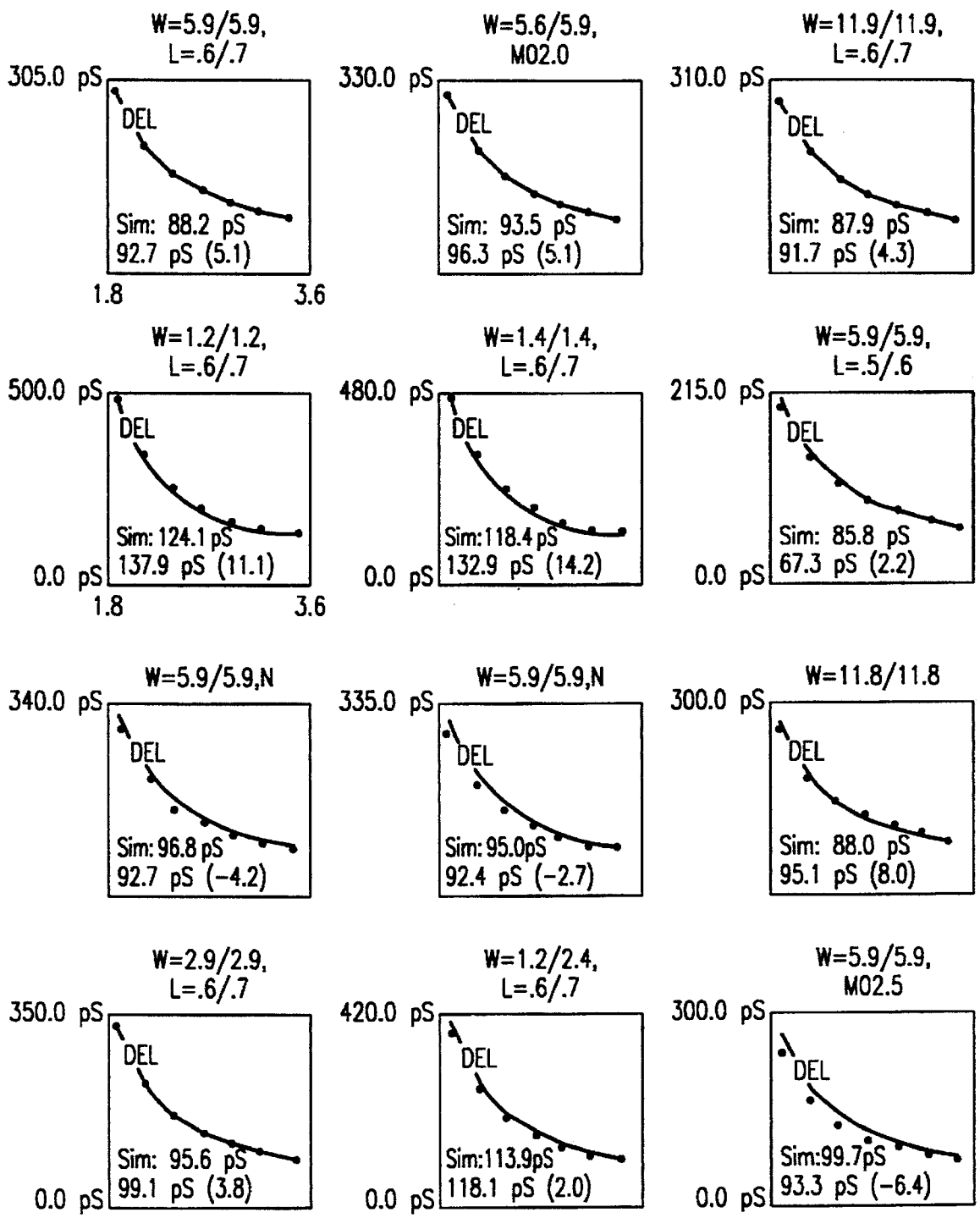
FIG. 16 illustrates a comparison of CMOS inverter chain measurements with SPICE simulations, the X-axis is Vdd from 1.8 to 3.6 Volts and the Y-axis is the delay chain speed (DEL) in ps, the widths and lengths for the n-ch/p ch are indicated for each chain.

The accuracy of this extracted TLD value was further verified through simulations and comparison with measurements of inverter chain delays of different design dimensions. This data shown in Fig. 16 is for delay time as a function of Vdd at room temperature. The variations in the delay chains included different W/L ratios for the n- and p-channel transistors and in some cases different values for the diffusion overlap of contact, indicated by 'MO' in the figure. The simulated and measured delay times at 3.6 V are indicated in the inset for each inverter and the percent deviation of the measurement from the simulation is indicated in brackets in each case. As can be seen, the overall agreement was within 10% for most cases.

The structure shown in Fig. 7 can be used to verify diffusion to substrate capacitance modeling also. This can be done by simply varying the diffusion area (A) and repeating the procedure in section III. Using area and perimeter values for the diode area, both the junction wall and sidewall pn capacitance components can be verified. Besides using for AC model derivation and/or verification, this structure can be used to monitor the lot to lot variations of TLD. This can be done by measuring the drain current response as shown in Fig. 9 at a fixed drain bias (say, 5 V) from device to device. Consolidating such data with the data on DC current variations should enable one to infer the true variations of the lateral diffusion in a MOSFET.

ACKNOWLEDGMENTS

The authors would like to thank Drs. Tom Holloway, Jerold Seitchik, and Bill Hunter for valuable comments and Dr. Carlos Dias (now with HP) for measurements with the e-beam equipment. Thanks are also due to Mr. Terry Machost for the DC current data and Mr. George Stacey for the AC inverter delay data.

REFERENCES

1. F. E. DeLaMoneda, H. N. Kotecha, and M. Shatzkes, "Measurements of MOSFET constants," IEEE Electron Device Letters, vol. EDL-3, 1982.

2. S. E. Laux, "Accuracy of effective channel/external resistance extraction algorithm for MOSFET's," IEEE Tran. on Electron Devices, vol. ED-31, 1984.

3. G. Hu, C. Chang and Y. Chia "Gate-voltage-dependent effective channel length and series resistance of LDD MOSFET's," IEEE Tran. on Electron Devices, vol. ED-34, No. 12, December 1987.

4. K. Terada and H. Muta, "A new method to determine MOSFET channel length," Japn J. Appl. Phys., vol. 18, p. 935, 1979.

5. B. J. Sheu, P. K. Ko, "A capacitance method to determine channel lengths for conventional and LDD MOSFETs, " IEEE Electron Device Letters, vol. EDL-5, no. 11, November 1984, p. 491.

6. C. F. Machala, J. L. Wise, J. H. Chern and P. Yang, "A Capacitance method to determine oxide thickness, gate length reduction and lateral diffusion in CMOS LDD devices," (to be published).

What is claimed is:

1. A method of deriving lateral diffusion in transistors, comprising:

establishing a DC model for the transistors, the model allowing for input of an estimate of the lateral diffusion;

isolating a gate of a test transistor;

applying a voltage pulse to a drain of the test transistor;

measuring a drain current of the test transistor;

using the DC model, generating a modelled current of a model transistor under substantially the same conditions as that of the test transistor;

comparing the measured drain current with the modelled current; and adjusting the estimate of lateral diffusion input to the DC model until the modelled current is substantially the same as the measured drain current, the value of the estimate of lateral diffusion that results in substantially the same current being substantially the correct value of the lateral diffusion.

2. The method of claim 1, wherein isolating comprises blowing a laser fuse to isolate the gate from other components.

3. The method of claim 1, wherein the DC model is established on a first transistor, and the test transistor is formed on the same die as the first transistor, the test transistor having a wider gate than the first transistor.

4. The method of claim 1, and further comprising verifying the DC model with actual current and voltage relationships on the test transistor before isolating the gate of the test transistor.

5. The method of claim 4, and further comprising adjusting the DC model such that the DC model substantially agrees with the actual current and voltage relationships.

6. The method of claim 1, wherein the modelling is performed with a SPICE design tool.

7. The method of claim 1, and further comprising applying additional voltage pulses to the drain of the test transistor, the voltage pulses having different voltage levels, and wherein measuring includes measuring drain current for each voltage pulse.

8. A method of deriving an AC model for transistors, comprising:

establishing a DC model for the transistors, the model allowing for input of an estimate of a parameter related to lateral diffusion;

isolating a gate of a test transistor;

applying a voltage pulse to a drain of the test transistor;

measuring a drain current of the test transistor;

using the DC model, generating a modelled current of a model transistor under substantially the same conditions as that of the test transistor;

comparing the measured drain current with the modelled current; and adjusting the estimate of the parameter input to the DC model until the modelled current is substantially the same as the measured drain current, the value of the estimate of the parameter that results in substantially the same current being substantially the correct value of the parameter.

9. The method of claim 8, wherein the parameter is the total lateral diffusion.

10. The method of claim 8, wherein the parameter is the capacitance substantially attributable to the total lateral diffusion.

11. The method of claim 8, wherein isolating comprises blowing a laser fuse to isolate the gate from other components.

12. The method of claim 8, wherein the DC model is established on a first transistor, and the test transistor is formed on the same die as the first transistor, the test transistor having a wider gate than the first transistor.

13. The method of claim 8, and further comprising verifying the DC model with actual current and voltage relationships on the test transistor before isolating the gate of the test transistor.

14. The method of claim 13, and further comprising adjusting the DC model such that the DC model substantially agrees with the actual current and voltage relationships.

15. The method of claim 8, and further comprising applying additional voltage pulses to the drain of the test transistor, the voltage pulses having different voltage levels, and wherein measuring includes measuring drain current for each voltage pulse.

16. The method of claim 9, and further comprising:

a first transistor formed on a die, said DC model being established through use of said first transistor; and said test transistor being formed on said die, the gate of said test transistor being wider than a gate of said first transistor.

17. A system for generating an AC model of transistors, comprising:

a design tool operable to establish a DC model for the transistors, said design tool allowing for input of an estimate of a parameter related to lateral diffusion;

a test transistor having a drain and a gate which can be isolated;

a current probe operable to measure a drain current of said test transistor, with said gate isolated, in response to a voltage pulse applied to the drain of said test transistor;

said design tool operable to generate a modelled current of a model transistor under substantially the same conditions as that of said test transistor, and further operable to adjust said estimate of said parameter until said modelled current is substantially the same as said measured drain current, the value of said estimate of said parameter that results in substantially the same current being substantially the correct value of said parameter.

18. The system of claim 17, wherein said parameter is the total lateral diffusion.

19. The system of claim 17, wherein said parameter is the capacitance substantially attributable to the total lateral diffusion.

20. The system of claim 17, and further comprising a laser fuse coupled to said gate.

* * * * *